(12) United States Patent
Yoshida et al.

(10) Patent No.: US 12,105,252 B2
(45) Date of Patent: Oct. 1, 2024

(54) THIN FILM FORMING METHOD AND POROUS THIN FILM

(71) Applicants: Kunio Yoshida, Neyagawa (JP); OKAMOTO OPTICS, INC., Neyagawa (JP)

(72) Inventors: Kunio Yoshida, Neyagawa (JP); Takayuki Okamoto, Yokohama (JP)

(73) Assignees: Kunio Yoshida, Neyagawa (JP); OKAMOTO OPTICS, INC., Yokohama (JP)

( * ) Notice: Subject to any disclaimer, the term of this patent is extended or adjusted under 35 U.S.C. 154(b) by 592 days.

(21) Appl. No.: 16/523,855

(22) Filed: Jul. 26, 2019

(65) Prior Publication Data

US 2020/0041694 A1 Feb. 6, 2020

(30) Foreign Application Priority Data

Jul. 31, 2018 (JP) .................. 2018-143083

(51) Int. Cl.
  *G02B 1/11* (2015.01)
  *C23C 14/02* (2006.01)
  *C23C 14/08* (2006.01)
  *C23C 14/12* (2006.01)
  *C23C 14/24* (2006.01)

(52) U.S. Cl.
  CPC .............. *G02B 1/11* (2013.01); *C23C 14/024* (2013.01); *C23C 14/08* (2013.01); *C23C 14/12* (2013.01); *C23C 14/24* (2013.01)

(58) Field of Classification Search
  None
  See application file for complete search history.

(56) References Cited

U.S. PATENT DOCUMENTS 5,991,081 A * 11/1999 Haaland ................ C03C 17/256
                                                    359/580

FOREIGN PATENT DOCUMENTS

| EP | 1123905 A2 | 8/2001 |
| JP | 08101301 A * | 4/1996 |
| JP | H08-101301 A | 4/1996 |
| JP | H10-29896 A | 2/1998 |
| JP | 2001-011602 A | 1/2001 |
| JP | 2013-217977 A | 10/2013 |

(Continued)

OTHER PUBLICATIONS

Extended European Search Report for corresponding European Patent Application No. 19186575.7 dated Dec. 18, 2019 (8 sheets).

(Continued)

*Primary Examiner* — Michael G Miller
(74) *Attorney, Agent, or Firm* — Kratz, Quintos & Hanson, LLP

(57) ABSTRACT

A thin film forming method includes: attaching a mixture of a dielectric material and a fluorocarbon resin as a first layer on a substrate; and thereafter attaching only a dielectric material as a second layer on the first layer to form a two-layer thin film on the substrate. The method is capable of manufacturing a thin film whose production is easy and costs low, whose substances attached by vapor deposition or the like do not easily suffer cracking, peeling, breakage, and so on, and in which a low refractive index is achieved in a wide band by freely controlling its packing ratio.

19 Claims, 4 Drawing Sheets

(56) References Cited

FOREIGN PATENT DOCUMENTS

| | | | |
|---|---|---|---|
| JP | 2015206908 A | * | 11/2015 |
| JP | 2016069720 A | * | 5/2016 |
| JP | 2019-59986 A | | 4/2019 |
| WO | 2002/018981 A1 | | 3/2002 |

OTHER PUBLICATIONS

Office Action of Japanese Patent Application No. 2018-143083 dated Apr. 12, 2022: Notice of Reasons for Refusal (3 sheets).

* cited by examiner

THIN FILM FORMING METHOD AND POROUS THIN FILM

BACKGROUND OF THE INVENTION

1. Field of the Invention

The present invention relates to a thin film forming method capable of manufacturing a thin film whose production is easy and costs low, whose substances attached by vapor deposition or the like do not easily suffer cracking, peeling, breakage, and so on, and in which a low refractive index is achieved in a wide band by freely controlling a packing ratio, and relates to a porous thin film manufactured by this method. In particular, the present invention not only facilitates the production of optical elements such as antireflection films, reflection mirrors, polarizers, and filters and enables the stable use of these but also is suitable for the production of optical elements used in cameras, displays, and lasers, astronomical telescopes for use in a wide wavelength range from the deep ultraviolet wavelength region to the infrared wavelength region.

2. Description of the Related Art

A vacuum vapor deposition method and a chemical treatment method are typically used to form optical thin films adopted in antireflection films, high reflection films, polarizing films, filters, and so on. Examples of an antireflection film formed by the vacuum vapor deposition method include: one made of a single-layer film which is formed by vapor-depositing, on a vapor deposition substrate, a vapor deposition substance lower in refractive index than the vapor deposition substrate to a ¼ film thickness of a wavelength λ of designated incident light; and one made of a multilayer film which is formed by stacking two or more layers of vapor deposition substances with a low refractive index and a high refractive index. Further, it is known that high reflection films, polarizing films, filters, and so on are produced by staking multilayers of vapor deposition substances with a low refractive index and a high refractive index on a vapor deposition substrate by a vapor deposition method.

Since vapor deposition substances used in optical thin films are mostly high in melting point, a substrate temperature during vapor deposition is ½ of the melting point of the vapor deposition substances or lower. Accordingly, in most cases, the optical thin film becomes columnar grains with a columnar structure which grow in a direction perpendicular to a boundary surface between the optical thin film and the substrate. The columnar grains have roughly a circular cylindrical shape with a several ten nm diameter, and between grain boundaries of the columnar grains, there are voids in a thin hole shape along a section of the optical thin film. Since columnar grain interfaces which form the thin holes are large in area, the optical thin film is exposed to the surrounding atmosphere and accordingly, optical properties of an optical thin film formed of a multilayer film is greatly influenced by the surrounding atmosphere.

Let a packing ratio (packing density) of an optical thin film, which is an index when there is a variation in refractive index in the thickness direction of the film (inhomogeneous film) be p, the packing ratio p can be defined by the following formula (1):

$$p = V_1/V_2 \quad \text{formula (1),}$$

where $V_1$ represents the volume of a substance part of the optical thin film (volume of columnar grains), and $V_2$ represents the volume of the entire optical thin film (total volume of the columnar grains and voids). A value of the packing ratio p, if thus defined, in the optical thin film is normally within a range of 0.7 to 1.0, is most often 0.8 to 0.95, and is rarely 1.

Since the packing ratio p is less than 1 as described above, the refractive index of the optical thin film is smaller than the refractive index of the substance part of the optical thin film. The refractive index $n_f$ of the optical thin film can be represented by the following formula (2):

$$n_f = pn_s + (1-p)n_v \quad \text{formula (2),}$$

where $n_s$ represents the refractive index of the substance part of the optical thin film, and $n_v$ represents the refractive index of the voids.

From the formula (1), it follows that increasing the voids in the optical thin film enables a reduction in the packing ratio p, resulting in a reduction in the refractive index $n_f$ of the optical thin film. In the 1980s, active studies started for greatly decreasing the packing ratio to about 50% and producing an antireflection film formed of a single-layer film.

As for the chemical treatment method, Milam et al. of Lawrence Livermore National Laboratory, USA, formed a porous silica thin film with a 0.1% to 0.3% reflectance on a quartz substrate surface by a sol-gel method. Further, Thomas of the same laboratory formed porous thin films of $MgF_2$ and $CaF_2$, which are fluorides, on a quartz glass substrate and a $CaF_2$ substrate by a sol-gel method.

On the other hand, the inventors of the present application have proposed a method which uses both the vapor deposition method and the chemical treatment method. This method vapor-deposits water-soluble and water-insoluble vapor deposition substances by a binary simultaneous vacuum vapor deposition method to form a mixed thin film, and thereafter removes the water-soluble substance in the mixed thin film by dissolving it in pure water, to form a porous thin film made of the water-insoluble substance on a substrate. Patent Document 1 below discloses details of the method for forming such a porous thin film.

Further, Tatsuya Kitamoto of Nikon Corporation formed a fluoride porous thin film by forming a mixed thin film made of silicon dioxide and a fluoride on a substrate and thereafter removing only the silicon dioxide using a hydrogen fluoride gas or a fluorine gas. Patent Document 2 below discloses a method for manufacturing this fluoride thin film.

As a prior art, Patent Document 3 below which was filed by the inventors and has been made open to the public is known. Specifically, this method forms a mixed thin film by simultaneously vapor-depositing, on a vapor deposition substrate surface, two kinds of substances consisting of: one of four kinds of substances which are an oxide, a fluoride, a semiconductor, and a metal; and a plastic, so as to make the plastic penetrate in the front surface of the vapor deposition substrate. The art disclosed in Patent Document 3 succeeded in forming an optical thin film having a multilayer structure by stacking high-refractive-index materials and low-refractive-index materials.

Patent Document 1: International Publication No. WO2002/018981
Patent Document 2: Japanese Patent Application Laid-open No. 2001-11602
Patent Document 3: Japanese Patent Application Laid-open No. 2016-69720

However, the above-described conventional thin film forming methods have the following various problems.

Since the refractive index of the optical thin film formed by the conventional vacuum vapor deposition method is determined by the vapor deposition substance, the method has great difficulty in producing an antireflection film, a high reflection film, a polarizing film, a filter, and so on having excellent properties. Another problem is that, due to a difference in thermal expansion coefficient between the substrate and the vapor deposition substance, an internal stress is generated in the formed optical thin film to cause the cracking of the optical thin film or the peeling of the optical thin film.

Further, in this vacuum vapor deposition method, an absorbing layer is formed locally on a boundary between the substrate surface and the vapor-deposited optical thin film, and this absorbing layer, which is covered with the high-density optical thin film, cannot be removed by ultrasonic cleaning or laser cleaning by laser irradiation and remains as it is. As a result, when the optical thin film is irradiated with high-power laser light, the absorbing layer is plasmatized by the irradiation with the high-power laser light, which may cause the breakage of the optical thin film.

Further, to manufacture a wide-band antireflection film, used is a method which stacks about five to about nine layers of two kinds of vapor deposition substances with a high refractive index and a low refractive index or a method which stacks 100 to 300 layers of two kinds of substances whose thickness is $1/100$ to $1/300$ of that of a single-layer film whose thickness is A/4, but these methods are not practical because of their high manufacturing costs.

The porous silica thin film formed by the sol-gel method by Milam et al. and the porous $MgF_2$ thin film and the porous $CaF_2$ thin film formed by the sol-gel method by Thomas have a reflectance of 0.5% or less at a predetermined wavelength and have laser resistant strength twice or more as high as that of the thin film formed by the vacuum vapor deposition method, but their surfaces are mechanically weak. Since the sol-gel method forms the porous thin film by attaching colloidal particles onto the substrate surface using Van der Waals force, the porous thin film easily peels off when given external mechanical force.

The aforesaid method disclosed in Patent Document 1 proposed by the inventors of the present application, which uses both the vacuum vapor deposition method and the chemical treatment method to form the mixed thin film and thereafter form the porous thin film, has great difficulty in forming a multilayer film in a vacuum since the mixed thin film is made porous by the pure water treatment. Further, this method, though is capable of greatly decreasing the packing ratio of the thin film to about 50%, is not capable of attaining a necessary refractive index by freely controlling the packing ratio.

The aforesaid method disclosed in Patent Document 2 by Tatsuya Kitamoto, which forms the fluoride porous thin film by removing the silicon dioxide using the gas, has difficulty in forming a multilayer film because it is capable of manufacturing only the fluoride thin film and requires a long time to completely remove the silicon dioxide. Further, the art disclosed in Patent Document 3 by the inventors, though capable of producing the optical thin film having the multilayer structure, is not capable of sufficiently reducing the manufacturing cost and in addition, is not capable of producing an optical thin film with a multilayer structure having a low refractive index in a wide band.

SUMMARY OF THE INVENTION

The present invention was made in consideration of the above-described background, and its object is to provide a thin film forming method capable of manufacturing a thin film whose production is easy and costs low, whose substances attached by vapor deposition or the like do not easily suffer cracking, peeling, breakage, and so on, and in which a low refractive index is achieved in a wide band by freely controlling a packing ratio, and to provide a porous thin film manufactured by this method.

A thin film forming method according to a first aspect of the present invention includes: attaching a mixture of a dielectric material and a fluorocarbon resin as a first layer on a substrate; and thereafter attaching only a dielectric material as a second layer on the first layer to form a two-layer thin film on the substrate.

In the present invention, for example, in a case where an antireflection film having a two-layer structure is formed on a substrate, according to this aspect, the mixed film which is formed by attaching the mixture of the dielectric material and the fluorocarbon resin on the substrate is the first layer as described above. This is because plastics except a fluorocarbon resin do no transmit light in regions except the visible region, but a fluorocarbon resin is capable of transmitting light in a wide band ranging from the ultraviolet region to the infrared wavelength region (200 nm to 8000 nm).

Further, the use of, as the first layer, the fluorocarbon resin such as polytetrafluoroethylene which has many depletion layers and absorbs laser light only a little greatly increases the laser resistant strength of the antireflection film to make it difficult for the thin film to be broken even by strong laser light. Further, attaching only the dielectric material as the second layer on the first layer to overcoat the porous thin film with the dielectric material enables an increase in the surface hardness of the porous thin film to prevent damage caused by friction or the like.

Further, since the fluorocarbon resin of the first layer has many depletion layers and thus is porous, it has the smallest refractive index, though causing a large scattering loss. Therefore, as a ratio of the fluorocarbon resin becomes larger in accordance with the attachment of the mixture of the dielectric material and the fluorocarbon resin as the first layer on the substrate, the refractive index tends to be smaller due to the influence of the fluorocarbon resin.

That is, it is possible to freely control the refractive index of the first layer only by adjusting the amount of the fluorocarbon resin with respect to the dielectric material, enabling the easy and low-cost production of a porous thin film having any required refractive index.

From the above, the thin film forming method according to this aspect is capable of manufacturing a simple thin film with a porous structure including a porous thin film having a low refractive index in a wide band, by attaching the two-layer thin film on the substrate. In addition, owing to the two-layer structure in which the layers both include the dielectric material and thus have similar compositions, an internally generated stress reduces to about $1/5$ to about $1/10$, leading to a solution to the problems such as the fine cracking (crazing) or the peeling of the thin film, which are the problems of the conventional thin films, and also leading to an increase in laser resistant strength to, for example, about twice as high as that of the conventional thin films.

Accordingly, the use of the invention of this aspect not only enables a great improvement in the performance and properties of the antireflection film in which the porous thin film being the optical thin film is attached, but also a great improvement in the performance and properties of other optical elements for optical apparatuses and optical elements for lasers including a high-power laser.

In this aspect, the method may further include attaching only a fluorocarbon resin as an undercoat layer between the substrate and the first layer to form a three-layer thin film on the substrate. The presence of the undercoat layer further improves laser resistant strength which is important for avoiding the problem which may occur on a boundary surface between the substrate surface and the thin film being the first layer.

In this aspect, the method may further include: attaching only a dielectric material as an undercoat layer between the substrate and the first layer; thereafter repeatedly attaching the first layer and the second layer a plurality of times to stack the first layers and the second layers; and attaching a mixture of a dielectric material and a fluorocarbon resin as a third layer on the uppermost second layer to form a multilayer thin film on the substrate.

That is, as a result of forming, on the substrate, the multilayer thin film in which the first layer and the second layer are repeatedly attached a plurality of times to be stacked, the same operation and effect as those of the above-described first aspect are brought about to greatly improve the performance and properties of the antireflection film, and in addition, since the porous thin film becomes the multilayer thin film with the multilayer structure, it can be made into a high reflection mirror and a polarizer.

In the above, the method may further include, after stacking the third layer, attaching only a fluorocarbon resin as a fourth layer on the third layer and attaching only a dielectric material as a fifth layer on the fourth layer, or may further include attaching only a fluorocarbon resin as a subcoat layer between the substrate and the undercoat layer.

That is, in the case where this multilayer thin film is made into the high reflection mirror, the fluorocarbon resin is attached as the fourth layer in order to improve laser resistant strength, and finally only the dielectric material is attached as the fifth layer. Further, in the case where this multilayer thin film is made into the polarizer, since incident light, after emitted to a target, is reflected by the target to return while being amplified by an amplifier, the fluorocarbon resin is used as the subcoat layer so as to achieve resistance against the laser light incident from both directions.

A porous thin film according to a second aspect of the present invention has a two-layer structure by including: a first layer made of a mixture of a dielectric material and a fluorocarbon resin attached on a substrate; and a second layer made of a dielectric material attached on the first layer.

In a case where a porous thin film which is made into an antireflection film with a two-layer structure is formed on a substrate, according to this aspect, the layer which is made of the mixture of the dielectric material and the fluorocarbon resin attached on the substrate is the first layer. This is because, as described in the first aspect, plastics except a fluorocarbon resin do not transmit light in regions except the visible region, but a fluorocarbon resin is capable of transmitting light in a wide band ranging from the ultraviolet region to the infrared wavelength region (200 nm to 8000 nm).

Further, the use of, as the first layer, the layer containing the fluorocarbon resin which has many depletion layers and absorbs laser light only a little greatly increases laser resistant strength to make it difficult for the thin film to be broken even by strong laser light. Further, attaching only the dielectric material as the second layer on the first layer to overcoat the porous thin film with the dielectric material enables an increase in the surface hardness of the porous thin film to prevent damage caused by friction or the like.

On the other hand, the fluorocarbon resin has the smallest refractive index. Therefore, in accordance with the attachment of the first layer made of the mixture of the dielectric material and the fluorocarbon resin, the refractive index of the first layer also tends to be smaller due to the influence of the fluorocarbon resin. That is, it is possible to freely control the refractive index of the first layer only by adjusting the amount of the fluorocarbon resin with respect to the dielectric material, enabling the easy and low-cost production of a porous thin film having any required refractive index.

From the above, the porous thin film according to this aspect brings about the same operation and effect as those of the film forming method of the first aspect. Specifically, not only it can be a simple thin film having a low refractive index in a wide band but also an internally generated stress reduces to about $1/5$ to about $1/10$, leading to a solution to the problems such as the fine cracking (crazing) or the peeling of the thin film, which are the problems of the conventional thin films, and also leading to an increase in laser resistant strength to, for example, about twice as high as that of the conventional thin films.

In this aspect, the porous thin film may have a three-layer structure by further including an undercoat layer made only of a fluorocarbon resin attached between the substrate and the first layer. Similarly to the preferable example of the thin film forming method of the first aspect, this structure is capable of further improving laser resistant strength which is important for avoiding the problem which may occur on a boundary surface between the substrate surface and the thin film being the first layer. In this case, the fluorocarbon resin of the undercoat layer may have a film thickness of 10 nm to 40 nm as an appropriate film thickness.

A porous thin film according to a third aspect of the present invention includes:

an undercoat layer made only of a dielectric material attached on a substrate;

a continuous layer which includes a first layer made of a dielectric material and a fluorocarbon resin which are attached while mixed and a second layer made of a dielectric material attached on the first layer, and in which the first layer and the second layer are repeatedly stacked a plurality of times on the undercoat layer; and a third layer made of a mixture of a dielectric material and a fluorocarbon resin attached on the uppermost second layer.

As a result of providing, on the substrate, such a multilayer thin film in which the first layer and the second layer are repeatedly attached a plurality of times to be stacked, the same operation and effect as those in the preferable example in the thin film forming method of the first aspect are brought about to greatly improve the performance and properties of an antireflection film, and in addition, since the porous thin film becomes the multilayer thin film having the multilayer structure, it can be made into a high reflection mirror and a polarizer.

In the above, the porous thin film may further include: a fourth layer made only of a fluorocarbon resin on the third layer after the third layer is stacked; and a fifth layer made only of a dielectric material attached on the fourth layer, and may further include a subcoat layer made only of a fluorocarbon resin attached between the substrate and the undercoat layer.

That is, in the case where this multilayer thin film is made into the high reflection mirror, the fluorocarbon resin is attached as the fourth layer in order to improve laser resistant strength, and finally only the dielectric material is attached as the fifth layer. Further, in the case where this multilayer thin film is made into the polarizer, since incident light, after emitted to a target, is reflected by the target to return while being amplified by an amplifier, the fluorocarbon resin is used as the subcoat layer so as to achieve resistance against the laser light incident from both directions.

In the porous thin films of the above second and third aspects, the dielectric material may be an oxide or a fluoride, the oxide may be one of $SiO_2$, $Al_2O_3$, $CeO_2$, $HfO_2$, $Ta_2O_5$, $ThO_2$, $TiO_2$, $ZrO_2$, $Sc_2O_3$, $Y_2O_3$, $La_2O_3$, and $Nd_2O_3$, and the fluoride may be one of $MgF_2$, $AlF_3$, $CaF_2$, $LaF_3$, $NdF_3$, $YbF_3$, and $YF_3$.

In the porous thin films of the above second and third aspects, the fluorocarbon resin may be one of polytetrafluoroethylene (PTFE), perfluoroalkoxyalkane (PFA), a perfluoroethylene-propane copolymer (FEP), an ethylene-tetrafluoroethylene polymer (ETFE), and a tetrafluoroethylene-perfluorodioxole copolymer (TFE/PDD).

In the porous thin films of the above second and third aspects, the first layer and the second layer may each have a film thickness equal to ¼ of a wavelength of light transmitted by the first layer and the second layer, the dielectric material of the second layer may have a film thickness of 10 nm to nm, and in the first layer, the fluorocarbon resin may have a volume five to fifty times as large as a volume of the dielectric material.

As described above, the present invention brings about excellent effects of providing a thin film forming method capable of manufacturing a thin film whose production is easy and costs low, whose substances attached by vapor deposition or the like do not easily suffer cracking, peeling, breakage, and so on, and in which a low refractive index is achieved in a wide band by freely controlling a packing ratio, and of providing a porous thin film produced by this method.

DETAILED DESCRIPTION OF THE PREFERRED EMBODIMENTS

A first embodiment of the thin film forming method and the porous thin film according to the present invention will be hereinafter described in detail based on the drawings.

Figure 1:
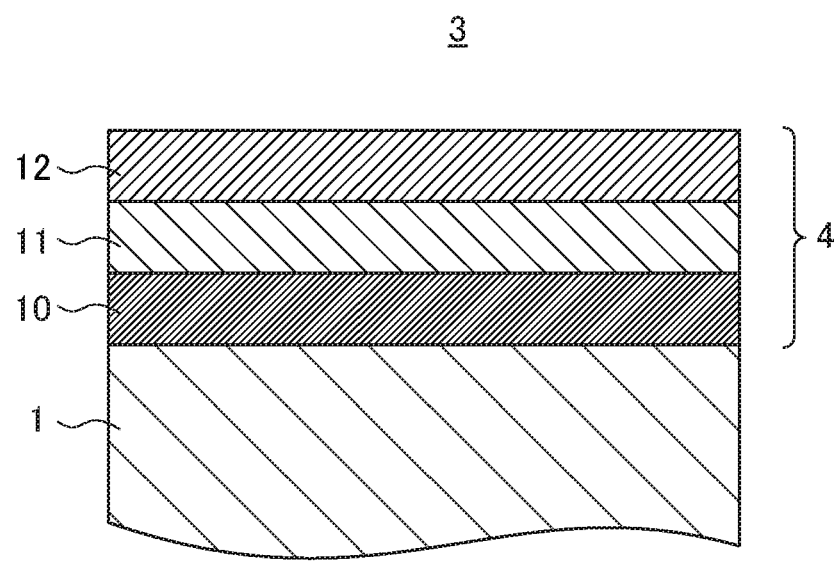
FIG. 1 is a sectional view illustrating a layer structure of a porous thin film according to a first embodiment of the present invention in a completed state.

First, the formation of a thin film with a three-layer structure whose layers are porous, on a substrate surface will be described. FIG. 1 is a sectional view illustrating a layer structure of the porous thin film according to this embodiment which is completed through the vapor deposition of thin films on a vapor deposition substrate. In this embodiment, the layers are porous thin films low in density and are formed into an antireflection film.

On a surface of a vapor deposition substrate 1 used in the optical element, a simple substance of a fluorocarbon resin which has many depletion layers and thus becomes a porous thin film is vapor-deposited to form a base layer 10 as an undercoat layer. Two kinds of substances which are a dielectric material and a fluorocarbon resin are mixed and simultaneously vapor-deposited on the base layer 10 such that the fluorocarbon resin penetrates in a surface of the base layer 10, to form a mixed thin film 11 illustrated in FIG. 1 as a first layer. Note that the dielectric material used here is one of two kinds of substances which are an oxide and a fluoride.

Regarding the mixed thin film 11, when the two kinds of substances are simultaneously vapor-deposited, it is possible to vary a state of the vapor deposition substances by varying a mixture ratio of the fluorocarbon resin to one of the oxide and the fluoride. Then, on the mixed thin film 11, a dielectric material being one of two kinds of substances which are also an oxide and a fluoride is vapor-deposited to form an upper thin film 12 as a second layer. Accordingly, the upper thin film 12 is in contact with an external air layer 3.

At this time, out of the aforesaid vapor deposition substances, as the dielectric material of the first layer which is the mixed thin film 11 and the second layer which is the upper thin film 12, one substance out of the oxide such as silica ($SiO_2$) and the fluoride such as magnesium fluoride ($MgF_2$) is adopted.

Further, to form the base layer 10, the mixed thin film 11, and the upper thin film 12, any of various vapor deposition methods such as a vacuum vapor deposition method, a sputtering vapor deposition method, an ion plating method, and a chemical vapor deposition method, or a combined method of these is usable. Here, a vapor deposition apparatus and a vapor deposition method have to be designed so as to enable the fluorocarbon resin in the mixed thin film 11 to reach a deep position of the vapor deposition substance such as the oxide or the fluoride. As the fluorocarbon resin of the undercoat layer which is the base layer 10 and the first layer which is the mixed thin film 11, polytetrafluoroethylene (also called Teflon (registered trademark)) which is a fluorocarbon resin of one kind is adoptable.

Next, a dry process which heats the base layer 10, the mixed thin film 11, and the upper thin film 12 vapor-deposited by the aforesaid vapor deposition method, at a temperature of 150° C. to 350° C. is performed to partly remove the fluorocarbon resin. Then, as illustrated in FIG. 1, on the vapor deposition substrate 1, a porous thin film 4 whose main components are the dielectric material and the fluorocarbon resin is formed. Alternatively, in forming the porous thin film 4, after the dry process by the heating, the fluorocarbon resin is further partly removed from the base layer 10 and the mixed thin film 11 using oxygen plasma.

At this time, for the removal of the fluorocarbon resin from the base layer 10 and the mixed thin film 11, the heating is performed in an atmosphere of a fluorine gas corresponding to the kind of the fluorocarbon resin. Therefore, in the case where the fluorocarbon resin in the base layer 10 and the mixed thin film 11 is the aforesaid polytetrafluoroethylene or the like, by the heating at an about 300° C. temperature in this gas atmosphere, it is possible to partly remove the polytetrafluoroethylene. Consequently, on the vapor deposition substrate 1, the porous thin film 4 which is a thin film having a refractive index gradient is formed of the dielectric material, for example, $SiO_2$ or MgF$_2$, which is the residual vapor deposition substance, and the partly remaining fluorocarbon resin such as the polytetrafluoroethylene.

Specifically, by varying the state of the vapor deposition substances vapor-deposited on the vapor deposition substrate 1, it is possible to easily obtain the porous thin film 4 having a predetermined refractive index. Therefore, by varying a mixture ratio of the fluorocarbon resin to the dielectric material which is the other vapor deposition substance in the mixed thin film 11 for the purpose of controlling the refractive index, it is possible to freely vary a value of the refractive index of the porous thin film 4 having the refractive index gradient and also freely vary the refractive index gradient. An optical film thickness in the porous thin film 4 whose refractive index is thus controlled is given by a product of the refractive index and the film thickness of each part of the porous thin film 4, and this optical film thickness is set to ¼ of a wavelength λ of designated incident light, that is, set to λ/4.

For example, setting the refractive index of the porous thin film 4 smaller than the refractive index of the vapor deposition substrate 1 gives the antireflection film the smallest reflectance for the designated incident light if the optical film thickness is an odd multiple of λ/4. Accordingly, it is possible to obtain a wide-band antireflection film that is usable for light in a wide band ranging from the ultraviolet region to the infrared wavelength region (200 nm to 8000 nm). Further, in the porous thin film 4 having the aforesaid refractive index gradient, it is possible to reduce the reflectance more than in thin films formed by the vacuum vapor deposition method of conventional arts.

Next, the thin film forming method according to the present invention will be specifically described.

In a not-illustrated vacuum chamber, while the vapor deposition substrate 1 which was a quartz glass substrate with a 40 mm diameter was heated to 200° C., polytetrafluoroethylene being the fluorocarbon resin was vapor-deposited on the surface of the vapor deposition substrate 1, using one electron gun, thereby forming the base layer 10 as the undercoat layer. Next, by a binary simultaneous vacuum vapor deposition method using two electron guns, MgF$_2$ being the dielectric material and polytetrafluoroethylene being the fluorocarbon resin were vapor-deposited on the base layer 10 to form the mixed thin film 11 as the first layer. At this time, the mixed thin film 11 was produced with the mixture ratio of the polytetrafluoroethylene and MgF$_2$ being adjusted first to about 1:3 and finally to 2:1.

Specifically, an amount of the polytetrafluoroethylene was small and an amount of MgF$_2$ was large at first, but these amounts were varied by a uniform amount per unit time, whereby their compounding amounts were varied so that the ratio of the amount of MgF$_2$ and the amount of the polytetrafluoroethylene finally became 1:2. Consequently, a front surface side of the mixed thin film 11 contained a larger amount of the polytetrafluoroethylene than its bottom surface side. Further, the upper thin film 12 made of MgF$_2$ was formed as the second layer on the mixed thin film 11 by the vapor deposition using one electron gun.

Next, the base layer 10, the mixed thin film 11, and the upper thin film 12 which were produced in the above-described manner were heated at a temperature of 300° C. for ten minutes, whereby not only the polytetrafluoroethylene was partly removed from the base layer 10 but also the polytetrafluoroethylene was selectively and partly removed from the mixed thin film 11. As a result, the porous thin film 4 was obtained in which the mixed thin film 11 was a porous thin film mainly containing MgF$_2$ and had a linearly varying refractive index gradient. At this time, a fluorine gas corresponding to the polytetrafluoroethylene is introduced into the vacuum chamber, thereby enabling the quick removal of the polytetrafluoroethylene.

Here, data of the reflectance and the refractive index which were obtained when a mixture ratio of a dielectric material and a fluorocarbon resin in a thin film formed on a vapor deposition substrate of quartz glass will be described below.

First, according to the knowledge of the inventors, the refractive index of solid polytetrafluoroethylene is known as 1.35, but when a thin film of this polytetrafluoroethylene was vapor-deposited on a vapor deposition substrate of quartz glass, the reflectance was about 0.1% (packing ratio: about 70%) and the refractive index was about 1.25. Accordingly, when a mixed film of polytetrafluoroethylene and a dielectric material is produced, the refractive index of the mixed film tends to be smaller as the ratio of the polytetrafluoroethylene is larger.

Table 1 below shows a relation between ZrO$_2$ which is ordinarily used as an oxide and polytetrafluoroethylene which is a fluorocarbon resin. As is seen in Table 1, when the packing ratio of ZrO$_2$ was 100%, the reflectance was 13.6% and the refractive index was 1.8. On the other hand, when the fluorocarbon resin was contained and its ratio was gradually increased, the packing ratio of ZrO$_2$ decreased to 81%, 70%, and 55%, and when the packing ratio was 55%, values of the reflectance and the refractive index greatly reduced to 2.85% and 1.44 respectively.

TABLE 1

|  | FILLING FACTOR OF A (%) | REFLECTANCE (%) | REFRACTIVE INDEX |
| --- | --- | --- | --- |
| ONLY A | 100 | 13.6 | 1.8 |
| A AND B | 81 | 9 | 1.65 |
|  | 70 | 6.1 | 1.56 |
|  | 55 | 2.85 | 1.44 |

A: ZrO$_2$
B: POLYTETRAFLUOROETHYLENE

Further, Table 2 below shows a relation between Al$_2$O$_3$ which is also ordinarily used as an oxide and polytetrafluoroethylene which is a fluorocarbon resin. As is seen in Table 2, when the packing ratio of Al$_2$O$_3$ was 1000/6, the reflectance was 4.9% and the refractive index was 1.52. On the other hand, when the fluorocarbon resin was contained and its ratio was gradually increased, the packing ratio of Al$_2$O$_3$ decreased to 94%, 77%, and 57.7%, and when the packing ratio was 57.7%, values of the reflectance and the refractive index greatly reduced to 0.5% and 1.3 respectively.

TABLE 2

|  | FILLING FACTOR OF A (%) | REFLECTANCE (%) | REFRACTIVE INDEX |
| --- | --- | --- | --- |
| ONLY A | 100 | 4.9 | 1.52 |
| A AND B | 94 | 4 | 1.49 |
|  | 77 | 2 | 1.4 |
|  | 57.7 | 0.5 | 1.3 |

A: Al$_2$O$_3$
B: POLYTETRAFLUOROETHYLENE

From the data in Table 1 and Table 2, it has been confirmed that, as the ratio of the fluorocarbon resin to the dielectric material increases, the reflectance and the refractive index greatly lower, making it possible to produce an antireflection film having greatly improved performance and properties. In addition, it has been also confirmed that it is possible to greatly improve the performance and properties of optical elements for lasers and so on.

Besides, the refractive index of a homogeneous $MgF_2$ single-layer thin film formed by a conventional vacuum vapor deposition method is about 1.38, and when quartz glass is used as the vapor deposition substrate 1 in this case, the reflectance becomes 1.8%. Further, the reflectance of the quartz glass per surface is 3.7%, while, in the porous thin film 4 formed of the porous thin film mainly containing $MgF_2$, which is obtained in the above-described manner, it was possible to reduce the reflectance to 0.2%.

Figure 2:
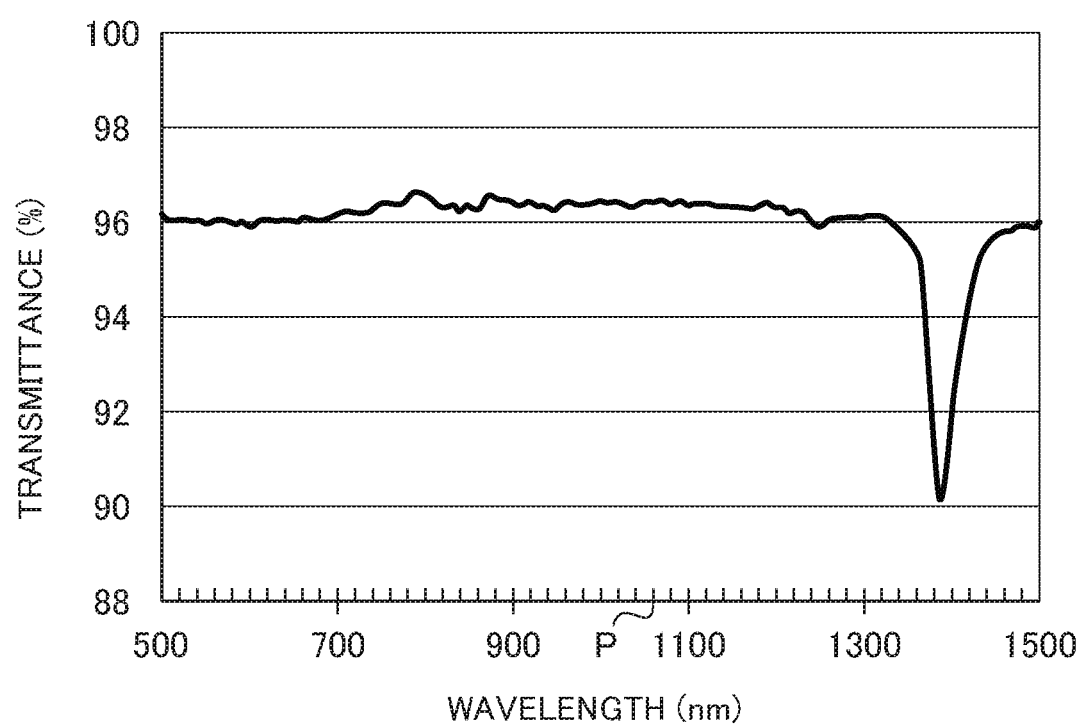
FIG. 2 is a graph representing a wavelength-transmittance relation in a porous $MgF_2$ thin film produced by a thin film forming method according to the first embodiment of the present invention.

FIG. 2 illustrates a transmittance characteristic curve which represents spectral characteristics of the porous $MgF_2$ thin film which coats one surface of the quartz glass substrate. As is seen in FIG. 2, the transmittance exceeds about 96% in a wavelength range of 500 nm to 1300 nm. Further, in particular, at a wavelength of 1064 nm at the measurement point P, the reflectance, though not illustrated, also reduces to 0.2 as described above. This leads to the understanding that the porous thin film 4 according to this embodiment is most suitable as an antireflection film because of its sufficiently high transmittance and sufficiently low reflectance.

As for an internally generated stress, in the mixed thin film 11 made of the fluorocarbon resin and $MgF_2$, a tensile stress was 495 kgf/cm², while, in the porous $MgF_2$ thin film obtained after the fluorocarbon resin was partly removed by heating, a tensile stress was 50 kgf/cm², that is, an about 1/10 stress. Further, the mixed thin film 11 from which the polytetrafluoroethylene was partly removed and which was made into the porous $MgF_2$ thin film had a similar tensile stress. Therefore, the problems such as the fine cracking (crazing), the peeling, or the like, which were the problems in the conventional thin films, were solved, and laser resistant strength was also about twice as high.

Laser resistant strength against laser with a 266 nm wavelength, which is a fourth harmonic of YAG laser, and a 5 ns pulse width was 5.9 J/cm² in the homogeneous $MgF_2$ thin film formed by the vacuum vapor deposition method, while, in the porous $MgF_2$ thin film, it was 7.2 J/cm² and thus was 1.2 times as high. Further, mechanical strength was substantially equal to that of the $MgF_2$ vapor-deposited film, owing to the overcoating with $MgF_2$ having a film thickness of about 50 Å.

Next, the porous thin film 4 according to this embodiment produced by the above-described method will be described.

The porous thin film 4 according to this embodiment has, as an initial layer, the base layer 10 which is formed in such a way that the polytetrafluoroethylene, which, in the simple substance state, has many depletion layers and becomes a porous thin film as described above, is vapor-deposited to a film thickness of 10 nm to 40 nm on the surface of the vapor deposition substrate 1. The porous thin film 4 further has the mixed thin film 11 which is formed in such a way that the dielectric material being one of the two kinds of substances which are the oxide and the fluoride and the fluorocarbon resin being the polytetrafluoroethylene are mixed and simultaneously vapor-deposited on the base layer 10.

The porous thin film 4 further has the upper thin film 12 which is formed in such way that, on the mixed thin film 11, the dielectric material being one of the two kinds of substances which are the oxide and the fluoride are vapor-deposited to a 10 nm to 30 mn film thickness on the mixed thin film 11. Consequently, the porous thin film 4 has the three-layer structure. In this case, in the mixed thin film 11, the volume of the fluorocarbon resin is desirably five to fifty times as large as the volume of the dielectric material.

This is because plastics except a fluorocarbon resin do not transmit light in regions except the visible region, but the fluorocarbon resin such as the polytetrafluoroethylene forming the base layer 10 and the mixed thin film 11 of this embodiment can transmit light in a wide band ranging from the ultraviolet region to the infrared wavelength region (200 nm to 8000 nm).

Further, the use of the fluorocarbon resin such as the polytetrafluoroethylene which has many depletion layers and absorbs only a small amount of laser light as the base layer 10 and the mixed thin film 11 greatly increases laser resistant strength to make it difficult for the thin film to be broken even by strong laser light in the case where the porous thin film 4 is made into the antireflection film. Further, in this embodiment, since only the fluorocarbon resin is vapor-deposited as the base layer 10 between the vapor deposition substrate 1 and the mixed thin film 11, the base layer 10 contributes to a further improvement in laser resistant strength in a boundary surface between the surface of the vapor deposition substrate 1 and the mixed thin film 11.

Then, vapor-depositing only the dielectric material as the upper thin film 12 on the mixed thin film 11 to overcoat the porous thin film 4 with the dielectric material enables an increase in the surface hardness of the porous thin film 4 to prevent damage caused by friction or the like. Note that, as described above, the undercoat layer is the base layer 10, the first layer is the mixed thin film 11, and the second layer is the upper thin film 12.

Further, in addition to producing the porous thin film 4 using the binary simultaneous vacuum vapor deposition method and selectively and partly removing only the polytetrafluoroethylene from the mixed thin film 11, if, for example, $MgF_2$ is adopted as the dielectric material, $MgF_2$ becomes porous and accordingly, at least the mixed thin film 11 becomes porous. At this time, the fluorine gas corresponding to the polytetrafluoroethylene is introduced into the vacuum chamber, thereby enabling the quick removal of the polytetrafluoroethylene.

Further, the fluorocarbon resin of the mixed thin film 11 has many depletion layers and thus is porous, it has the smallest refractive index, though causing a large scattering loss. Therefore, as the ratio of the fluorocarbon resin becomes larger in accordance with the vapor deposition of the mixed thin film 11 made of the mixture of the dielectric material and the fluorocarbon resin, the refractive index tends to decrease due to the influence of the fluorocarbon resin as described above. That is, in such a porous thin film 4, it is possible to freely control the refractive index of the mixed thin film 11 only by adjusting the amount of the fluorocarbon resin with respect to the dielectric material. This enables the easy and low-cost production of the porous thin film 4 having any required refractive index.

From the above, the porous thin film 4 according to this embodiment is a simple thin film with the porous structure having a low refractive index in a wider band owing to the three-layer thin film vapor-deposited on the substrate. In addition, since the mixed thin film 11 and the upper thin film 12 contain the dielectric material and thus have similar compositions, the internally generated stress reduces to about 1/5 to about 1/10, leading to a solution to the problems such as the fine cracking (crazing) or the peeling of the thin film, which are the problems of the conventional thin films, and also leading to an increase in the laser resistant strength to, for example, about twice as high as that in the conventionally thin films.

Therefore, vapor-depositing the porous thin film 4 being the optical thin film according to this embodiment greatly improves the performance and properties of the antireflection film, and moreover, the porous thin film 4, when applied to other optical elements for optical apparatuses, optical elements for lasers including a high-power laser, and so on, can greatly improve their performance and properties.

At this time, as the dielectric material of the mixed thin film 11 and the upper thin film 12 out of the aforesaid vapor deposition substances, either substance out of the oxide such as silica ($SiO_2$) and the fluoride such as magnesium fluoride ($MgF_2$) is adopted.

However, the dielectric material may be any of other substances that have the same function. As the oxide, any of $Al_2O_3$, $CeO_2$, $HfO_2$, $Ta_2O_5$, $ThO_2$, $TiO_2$, $ZrO_2$, $Sc_2O_3$, $Y_2O_3$, $La_2O_3$, and $Nd_2O_3$ is usable, for instance. As the fluoride, any of $AlF_3$, $BaF_2$, $CaF_2$, $GdF_3$, $Na_5Al_3F_{14}$, $Na_3AlF_6$, $PbF_2$, $LaF_3$, $LiF$, $NdF_3$, $NaF$, $YbF_3$, and $YF_3$ is usable, for instance.

As the fluorocarbon resin of the base layer 10 and the mixed thin film 11 out of the aforesaid vapor deposition substances, polytetrafluoroethylene (PTFE) is adopted, but it may be any other substance that has the same function, and any of perfluoroalkoxyalkane (PFA), a perfluoroethylene-propane copolymer (FEP), an ethylene-tetrafluoroethylene polymer (FTFE), and a tetrafluoroethylene-perfluorodioxole copolymer (TFE/PDD) is usable.

Further, as the vapor deposition substrate 1, mainly used is a substrate of any of various kinds of optical glasses including quartz glass borosilicate crown glass (BK-7), and phosphate glass, crystals such as fluorite ($CaF_2$), crystal ($SiO_2$), and sapphire ($Al_2O_3$), crystals for lasers such as YAG and $Al_2O_3$, ceramic, a semiconductor, plastic, and metal.

In this embodiment, only the fluorocarbon resin is vapor-deposited to provide the base layer 10 being the undercoat layer, but a two-layer structure may be adopted which does not have the base layer 10 and in which the mixed thin film 11 is vapor-deposited as the first layer directly on the surface of the vapor deposition substrate 1 and the upper thin film 12 is vapor-deposited as the second layer on the mixed thin film 11.

Next, a second embodiment of the thin film forming method and the porous thin film according to the present invention will be described in detail based on the drawings.

First, a case where a multilayer thin film 6 being a porous thin film is produced using the thin film forming method according to this embodiment will be described. This embodiment gives a specific description, taking a high reflection mirror and a polarizer having the multilayer thin film 6 as an example.

Figure 3:
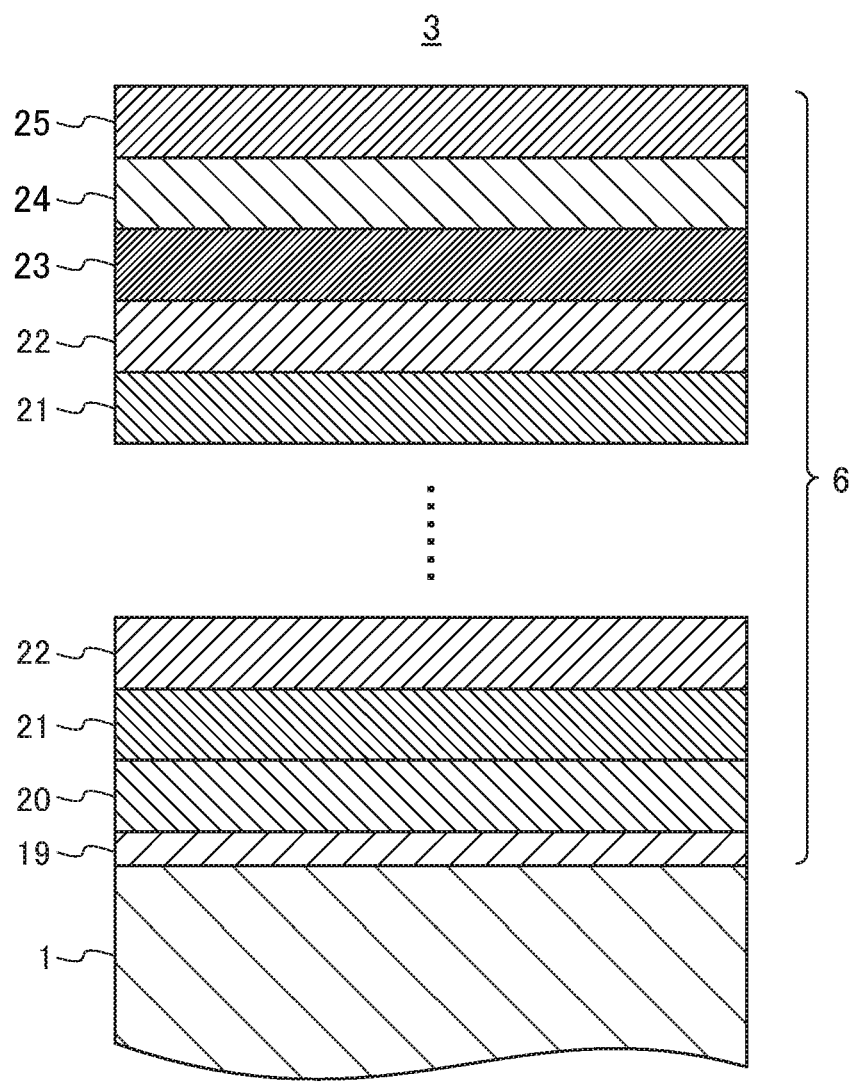
FIG. 3 is a sectional view illustrating a layer structure of a porous thin film according to a second embodiment of the present invention in a completed state.

As illustrated in FIG. 3, on a surface of a vapor deposition substrate 1 used in the optical element, only a fluorocarbon resin is first vapor-deposited as a subcoat layer 19, and thereafter only a dielectric material being one of two kinds of substances which are an oxide and a fluoride is vapor-deposited as a base layer 20 being an undercoat layer.

Next, on the base layer 20, two kinds of substances which are a dielectric material and a fluorocarbon resin are mixed and simultaneously vapor-deposited as a first thin film 21 being a first layer such that the fluorocarbon resin penetrates in a surface of the base layer 20. Thereafter, on the first thin film 21, only the aforesaid dielectric material is vapor-deposited as a second thin film 22 being a second layer. As a result, the double thin film layer illustrated in FIG. 3 composed of the first thin film 21 and the second thin film 22 is formed. At this time, for the vapor-deposition of the first thin film 21, a binary simultaneous vacuum vapor deposition method of the dielectric material and the fluorocarbon resin is performed.

That is, the first thin film 21 being the first layer of this embodiment corresponds to the mixed thin film 11 being the first layer of the first embodiment, and the second thin film 22 being the second layer of this embodiment corresponds to the upper thin film 12 being the second layer of the first embodiment.

Then, a set of the first thin film 21 and the second thin film 22 is repeatedly vapor-deposited a plurality of times, whereby the first thin films 21 and the second thin films 22 are stacked into a continuous layer as illustrated in FIG. 3. For example, in the case of the high reflection mirror, the total number of layers can be 10 to 20, and in the case of the polarizer including multilayers of dielectrics, the total number of layers can be 30 to 50. Thereafter, on the uppermost second thin film 22, a mixture of two kinds of substances which are a dielectric material and a fluorocarbon resin are simultaneously vapor-deposited as a third thin film 23 being a third layer such that the fluorocarbon resin penetrates in a surface of the second thin film 22.

After the third thin film 23 is thus stacked, only a fluorocarbon resin is further vapor-deposited as a fourth thin film 24 being a fourth layer on the third thin film 23, and then only a dielectric material is vapor-deposited as a final layer 25 being a fifth layer on the fourth thin film 24. Accordingly, the final layer 25 is in contact with an external air layer 3. Note that this embodiment also adopts polytetrafluoroethylene as each fluorocarbon resin.

Further, since the vapor deposition of the first thin film 21 and the third thin film 23 is performed by the binary simultaneous vacuum vapor deposition method of the dielectric material and the polytetrafluoroethylene, the vapor deposition substances of the first thin film 21 and the third thin film 23 contain the dielectric material which is ordinarily a low-refractive-index vapor deposition substance. This makes it possible to obtain a porous thin film with a lower refractive index.

Thereafter, as a result of selectively and partly removing only the polytetrafluoroethylene, the multilayer thin film 6 is completed. At this time, the removal of the polytetrafluoroethylene is performed at least by a dry process by heating in an atmosphere of a fluorine gas, which makes it possible to remove the polytetrafluoroethylene without giving an influence on the thin film itself.

Next, the multilayer thin film 6 being the porous thin film according to this embodiment produced by the above-described method will be described.

The multilayer thin film 6 according to this embodiment includes the base layer 20 being the undercoat layer formed of only the dielectric material vapor-deposited on the vapor deposition substrate 1. However, in this embodiment, only the fluorocarbon resin is vapor-deposited as the subcoat layer 19 between the vapor deposition substrate 1 and the base layer 20.

Then, the mixture of the dielectric material and the fluorocarbon resin is vapor-deposited as the first thin film 21 being the first layer on the base layer 20. Further, on the first thin film 21, only the dielectric material is vapor-deposited as the second thin film 22 being the second layer. Consequently, the double thin film layer composed of the two first thin film 21 and second thin film 22 is formed. In the multilayer thin film 6 according to this embodiment, the set of the first thin film 21 and the second thin film 22 is repeatedly stacked a plurality of times.

On the uppermost second thin film 22 which is at the top of these, the third thin film 23 being the third layer made of the two kinds of substances which are the dielectric material and the fluorocarbon resin is disposed by the vapor-deposition. Then, on the third thin film 23, the fourth thin film 24 being the fourth layer is disposed by the vapor-deposition of only the fluorocarbon resin, and on the fourth thin film 24, the final layer 25 being the fifth layer is disposed by the vapor deposition of only the dielectric material.

At this time, as in the first embodiment, in the layers containing the fluorocarbon resin, the polytetrafluoroethylene is adopted as the fluorocarbon resin, and in the layers containing the dielectric material, one substance out of the oxide such as silica ($SiO_2$) and the fluoride such as magnesium fluoride ($MgF_2$) is adopted.

Note that, as for this multilayer thin film 6 as well, the binary simultaneous vacuum vapor deposition method is used and only the polytetrafluoroethylene is selectively and partly removed from the layers of the multilayer thin film 6, so that at least the layers having the polytetrafluoroethylene are porous.

In the high reflection mirror including the above-described multilayer thin film 6, a large electric field tends to occur on a boundary part between the final layer 25 and the layer immediately preceding the final layer 25, but by disposing the porous fourth thin film 24 formed of the polytetrafluoroethylene as the layer immediately preceding the final layer 25, it is possible to reduce the field intensity and increase laser resistant strength.

Further, in the polarizer including the above-described multilayer thin film 6, incident light passes through the polarizer, or after laser light transmitted by the polarizer is reflected by a target, the light reverses while amplified by an amplifier, to pass through the polarizer. In this case as well, it is possible to reduce the field intensity and increase the laser resistant strength by disposing the porous fourth thin film 24 formed of the polytetrafluoroethylene as the layer immediately preceding the final layer 25.

This embodiment also adopts, as the dielectric material, one substance out of the oxide such as silica ($SiO_2$) and the fluoride such as magnesium fluoride ($MgF_2$), but as in the first embodiment, the dielectric material may be other oxide or fluoride. Further, as the fluorocarbon resin, for example, polytetrafluoroethylene is adoptable as described above, but as in the first embodiment, it may be a fluorocarbon resin of other kinds. Further, as the material of the vapor deposition substrate 1, the same material as that in the first embodiment is selectable.

Figure 4:
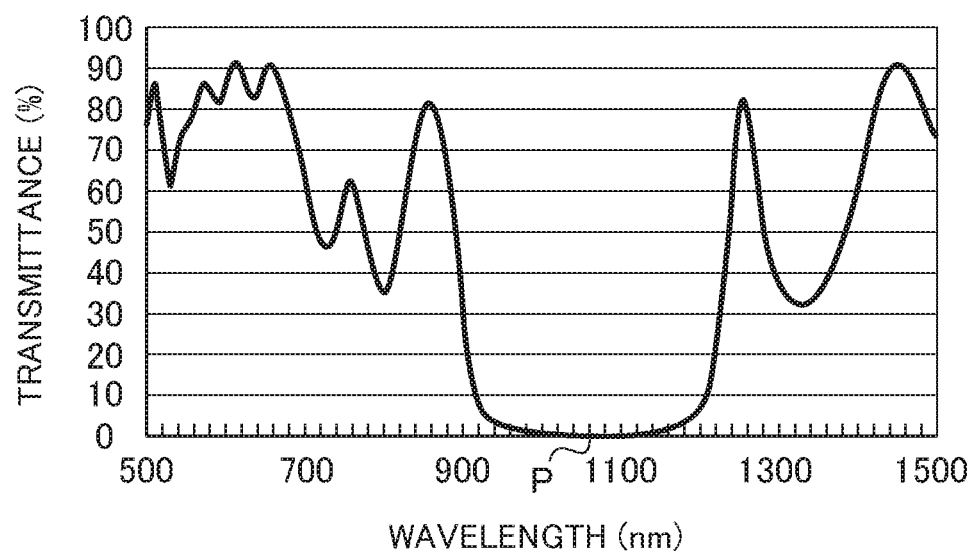
FIG. 4 is a graph illustrating a wavelength-transmittance relation in a multilayer thin film in which a $TiO_2$ layer and a porous $MgF_2$ layer containing a fluorocarbon resin are repeatedly stacked, the multilayer thin film being produced by a thin film forming method according to the second embodiment of the present invention.

Next, the transmittance and reflectance of magnesium fluoride ($MgF_2$) being a fluoride that is made porous will be described. Seven layers of $TiO_2$ as an oxide and seven porous $MgF_2$ layers including a fluorocarbon resin were repeatedly stacked by vapor deposition, and finally a layer of $TiO_2$ was stacked again by vapor deposition, whereby a reflection mirror constituted by the multilayer thin film 6 made up of the fifteen stacked layers was fabricated. FIG. 4 illustrates a transmittance characteristic curve which represents spectral characteristics of this reflection mirror. As illustrated in FIG. 4, the transmittance was almost 0% in a wavelength range of 900 nm to 1200 nm, and in particular, at a 1064 nm wavelength at the measurement point P, the reflectance, though not given in FIG. 4, was as high as 99.75%.

From the above, it has been confirmed that the above-described multilayer thin film 6 becomes a high reflection mirror whose transmittance is sufficiently low and whose reflectance is also sufficiently high, at the typically used 1064 nm wavelength.

Here, in the first embodiment and the second embodiment described above, the first layer and the second layer each preferably have a film thickness equal to λ/4 which is a thickness equal to ¼ of a wavelength of light which is transmitted or reflected by these layers. However, to improve the laser resistant strength of the reflection mirror and so on, the layer only of the fluorocarbon resin preferably has a film thickness of λ/4 or λ/2.

Further, in the second embodiment described above, as the fourth thin film 24 being the fourth layer, only the fluorocarbon resin is vapor-deposited on the third thin film 23, and as the final layer 25 being the fifth layer, only the dielectric material is vapor-deposited on the fourth thin film 24, but these fourth thin film 24 and final layer 25 are not indispensable. Further, the subcoat layer 19 between the vapor deposition substrate 1 and the base layer 20 is not indispensable.

In the first embodiment described above, the antireflection film is formed as the porous thin film, but the first embodiment may be applied to other optical elements. Further, in the second embodiment described above, the multilayer thin film is made into the high reflection mirror or the polarizer, but it may be used as other optical elements such as a band-pass filter. In the second embodiment described above, in the case where the high reflection mirror is formed using the first thin films 21 being the first layers and the second thin films 22 being the second layers, the total number of layers can be to 20, and in the case where the dielectric multilayer polarizer is formed using these films, the total number of layers can be 30 to 50, but the total number of layers may be a plural number other than these.

From the above, in the present invention, by controlling the packing ratio of the optical thin film used in a wavelength range from 200 nm to 8000 nm, that is, from the ultraviolet region to the infrared wavelength region, it is possible to obtain any required refractive index, and accordingly, it is possible to manufacture a thin film most suitable for optical apparatuses in this wavelength range. Further, by further overcoating the surface of the porous thin film with $MgF_2$ as required, it is also possible to achieve hardness with which the porous thin film is not easily damaged.

In the above-described embodiments, the vapor deposition is adopted for attaching the layers on the substrate, but the attachment may be performed by other bonding method such as coating. Further, the porous thin film in the above-described embodiments refers to one whose density (packing ratio) is 99% or less, though 100% in a solid state.

Further, in the embodiments above, it is described that the optical film thickness in the porous thin film is given by the product of the refractive index and the film thickness of each part of the porous thin film, but specifically, the thickness of the thin film can be measured with an atomic force microscope (AFM).

In the foregoing, the embodiments according to the present invention have been described, but the present invention is not limited to the above-described embodiments, and various modifications can be made based on the spirit of the present invention. These modifications are not excluded from the scope of the present invention.

The porous thin film obtained by the thin film forming method according to the present invention is most suitable as an optical element for laser systems including a high-power laser, an optical element for astronomical observation, and an optical element for optical apparatuses, especially for use in the infrared region not to mention the ultraviolet region to the visible region, for example, most suitable as protection glass for digital cameras, video cameras, liquid crystal projectors, paintings, and displays.

What is claimed is:

1. A porous thin film, the porous thin film having a two-layer structure by comprising:
 a base layer made of a first fluorocarbon resin vapor-deposited on a substrate;
 a first layer made of a mixture of a first dielectric material and a second fluorocarbon resin simultaneously vapor-deposited on the base layer; and
 a second layer made of a second dielectric material vapor-deposited on the first layer,
 wherein the first dielectric material is selected from among the group consisting of $SiO_2$, $Al_2O_3$, $CeO_2$, $HfO_2$, $Ta_2O_5$, $ThO_2$, $TiO_2$, $ZrO_2$, $Sc_2O_3$, $Y_2O_3$, $La_2O_3$, and $Nd_2O_3$ or is selected from among the group consisting of $MgF_2$, $AlF_3$, $CaF_2$, $LaF_3$, $NdF_3$, $YbF_3$, and $YF_3$,
 wherein the second dielectric material is selected from among the group consisting of $SiO_2$, $Al_2O_3$, $CeO_2$, $HfO_2$, $Ta_2O_5$, $ThO_2$, $TiO_2$, $ZrO_2$, $Sc_2O_3$, $Y_2O_3$, $La_2O_3$, and $Nd_2O_3$ or is selected from among the group consisting of $MgF_2$, $AlF_3$, $CaF_2$, $LaF_3$, $NdF_3$, $YbF_3$, and $YF_3$,
 wherein the first and second fluorocarbon resins are selected from among the group consisting of polytetrafluoroethylene (PTFE), perfluoroalkoxyalkane (PFA), a perfluoroethylene-propane copolymer (FEP), an ethylene-tetrafluoroethylene polymer (ETFE), and a tetrafluoroethylene-perfluorodioxole copolymer (TFE/PDD),
 wherein the second fluorocarbon resin of the first layer is partly removed to vary a mixture ratio of the second fluorocarbon resin to the first dielectric material, whereby the first layer has a refractive index gradient,
 wherein a front surface side of the first layer is in contact with the second layer and contains a first amount of the second fluorocarbon resin, wherein a bottom surface side of the first layer is in contact with the base layer and contains a second amount of the second fluorocarbon resin, and wherein the first amount of the second fluorocarbon resin is larger than the second amount of the second fluorocarbon resin,
 wherein a composition of the base layer is different from a composition of the first layer, wherein a range of refractive indices of the base layer is different from a range of refractive indices of the first layer, wherein the composition of the base layer is different from a composition of the second layer, and wherein the range of refractive indices of the base layer is different from a range of refractive indices of the second layer,
 wherein the first fluorocarbon resin is partially removed from the base layer, and
 wherein the base layer is porous.

2. The porous thin film according to claim 1, wherein an atmosphere of the porous thin film is selected to be a fluorine gas corresponding to the first and second fluorocarbon resins, and wherein the base layer is an undercoat layer.

3. The porous thin film according to claim 2, wherein the first fluorocarbon resin of the undercoat layer has a film thickness of 10 nm to 40 nm.

4. The porous thin film according to claim 2, wherein the undercoat layer has a film thickness equal to ½ of a wavelength of light transmitted by the undercoat layer.

5. The porous thin film according to claim 1, wherein the first dielectric material and the second dielectric material are $MgF_2$.

6. The porous thin film according to claim 1, wherein the first layer has a film thickness equal to ¼ of a wavelength of light transmitted by the first layer, and the second layer has a film thickness equal to ¼ of a wavelength of light transmitted by the second layer.

7. The porous thin film according to claim 1, wherein the second dielectric material of the second layer has a film thickness of 10 nm to 30 nm.

8. The porous thin film according to claim 1, wherein, in the first layer, the second fluorocarbon resin has a volume five to fifty times as large as a volume of the first dielectric material.

9. The porous thin film according to claim 1, wherein the front surface side of the first layer contains a first amount of the first dielectric material, wherein the bottom surface side of the first layer contains a second amount of the first dielectric material, and wherein the first amount of the first dielectric material is smaller than the second amount of the first dielectric material.

10. The porous thin film according to claim 9, wherein a ratio of the first amount of the second fluorocarbon resin to the first amount of the first dielectric material is 1:3, and a ratio of the second amount of the second fluorocarbon resin to the second amount of the first dielectric material is 2:1.

11. The porous thin film according to claim 1, wherein the second layer is in contact with an external air layer.

12. A porous thin film comprising:
 a subcoat layer made only of a first fluorocarbon resin vapor-deposited on a substrate;
 an undercoat layer made only of a first dielectric material vapor-deposited on the subcoat layer;
 a continuous layer which includes a first layer made of a mixture of a second dielectric material and a second fluorocarbon resin which are vapor-deposited while mixed and a second layer made of a third dielectric material vapor-deposited on the first layer, and in which the first layer and the second layer are repeatedly stacked a plurality of times on the undercoat layer; and
 a third layer made of a mixture of a fourth dielectric material and a third fluorocarbon resin vapor-deposited on the uppermost second layer,
 wherein the second dielectric material is selected from among the group consisting of $SiO_2$, $Al_2O_3$, $CeO_2$, $HfO_2$, $Ta_2O_5$, $ThO_2$, $TiO_2$, $ZrO_2$, $Sc_2O_3$, $Y_2O_3$, $La_2O_3$, and $Nd_2O_3$ or is selected from among the group consisting of $MgF_2$, $AlF_3$, $CaF_2$, $LaF_3$, $NdF_3$, $YbF_3$, and $YF_3$,
 wherein the third dielectric material is selected from among the group consisting of $SiO_2$, $Al_2O_3$, $CeO_2$, $HfO_2$, $Ta_2O_5$, $ThO_2$, $TiO_2$, $ZrO_2$, $Sc_2O_3$, $Y_2O_3$, $La_2O_3$, and $Nd_2O_3$ or is selected from among the group consisting of $MgF_2$, $AlF_3$, $CaF_2$, $LaF_3$, $NdF_3$, $YbF_3$, and $YF_3$,
 wherein the second fluorocarbon resin is selected from among the group consisting of polytetrafluoroethylene (PTFE), perfluoroalkoxyalkane (PFA), a perfluoroethylene-propane copolymer (FEP), an ethylene-tetrafluoroethylene polymer (ETFE), and a tetrafluoroethylene-perfluorodioxole copolymer (TFE/PDD),
 wherein the second fluorocarbon resin of the first layer is partly removed to vary a mixture ratio of the second fluorocarbon resin to the second dielectric material, whereby the first layer has a refractive index gradient, wherein the third fluorocarbon resin of the third layer is partly removed, wherein a composition of the subcoat layer is different from a composition of the undercoat layer, wherein a range of refractive indices of the subcoat layer is different from a range of refractive indices of the undercoat layer, wherein the composition of the subcoat layer is different from a composition of the first layer of the continuous layer, wherein the range of refractive indices of the subcoat layer is different from a range of refractive indices of the first layer of the continuous layer, wherein the composition of the subcoat layer is different from a composition of the second layer of the continuous layer, wherein the range of refractive indices of the subcoat layer is different from a range of refractive indices of the second layer of the continuous layer, wherein the composition of the subcoat layer is different from a composition of the third layer, and wherein the range of refractive indices of the subcoat layer is different from a range of refractive indices of the third layer, wherein the first fluorocarbon resin is partially removed from the subcoat layer, and wherein the subcoat layer is porous.

13. The porous thin film according to claim 12, wherein the third fluorocarbon resin of the third layer penetrates in a surface of the uppermost second layer.

14. The porous thin film according to claim 12, wherein the subcoat layer has a film thickness equal to ½ of a wavelength of light transmitted by the subcoat layer.

15. The porous thin film according to claim 12, wherein the first layer has a film thickness equal to ¼ of a wavelength of light transmitted by the first layer.

16. The porous thin film according to claim 12, wherein the second layer has a film thickness equal to ¼ of a wavelength of light transmitted by the second layer.

17. The porous thin film according to claim 12, wherein the third dielectric material of the second layer has a film thickness of 10 nm to 30 nm.

18. The porous thin film according to claim 12, wherein, in the first layer, the second fluorocarbon resin has a volume five to fifty times as large as a volume of the second dielectric material.

19. A porous thin film comprising:
a subcoat layer made only of a first fluorocarbon resin vapor-deposited on a substrate;
an undercoat layer made only of a first dielectric material vapor-deposited on the subcoat layer;
a continuous layer which includes a first layer made of a mixture of a second dielectric material and a second fluorocarbon resin which are vapor-deposited while mixed and a second layer made of a third dielectric material vapor-deposited on the first layer, and in which the first layer and the second layer are repeatedly stacked a plurality of times on the undercoat layer; and
a third layer made of a mixture of a fourth dielectric material and a third fluorocarbon resin vapor-deposited on the uppermost second layer;
a fourth layer made only of the first fluorocarbon resin attached on the third layer after the third layer is stacked; and
a fifth layer made only of a fifth dielectric material attached on the fourth layer, wherein the second dielectric material is selected from among the group consisting of $SiO_2$, $Al_2O_3$, $CeO_2$, $HfO_2$, $Ta_2O_5$, $ThO_2$, $TiO_2$, $ZrO_2$, $Sc_2O_3$, $Y_2O_3$, $La_2O_3$, and $Nd_2O_3$ or is selected from among the group consisting of $MgF_2$, $AlF_3$, $CaF_2$, $LaF_3$, $NdF_3$, $YbF_3$, and $YF_3$, wherein the third dielectric material is selected from among the group consisting of $SiO_2$, $Al_2O_3$, $CeO_2$, $HfO_2$, $Ta_2O_5$, $ThO_2$, $TiO_2$, $ZrO_2$, $Sc_2O_3$, $Y_2O_3$, $La_2O_3$, and $Nd_2O_3$ or is selected from among the group consisting of $MgF_2$, $AlF_3$, $CaF_2$, $LaF_3$, $NdF_3$, $YbF_3$, and $YF_3$, wherein the second fluorocarbon resin is selected from among the group consisting of polytetrafluoroethylene (PTFE), perfluoroalkoxyalkane (PFA), a perfluoroethylene-propane copolymer (FEP), an ethylene-tetrafluoroethylene polymer (ETFE), and a tetrafluoroethylene-perfluorodioxole copolymer (TFE/PDD), wherein the second fluorocarbon resin of the first layer is partly removed to vary a mixture ratio of the second fluorocarbon resin to the second dielectric material, whereby the first layer has a refractive index gradient, wherein the third fluorocarbon resin of the third layer is partly removed, wherein the third fluorocarbon resin of the third layer penetrates in a surface of the uppermost second layer, wherein the fifth layer is in contact with an external air layer, wherein an atmosphere of the porous thin film is selected to be a fluorine gas corresponding to the first and second fluorocarbon resins, wherein a composition of the subcoat layer is different from a composition of the undercoat layer, wherein a range of refractive indices of the subcoat layer is different from a range of refractive indices of the undercoat layer, wherein the composition of the subcoat layer is different from a composition of the first layer of the continuous layer, wherein the range of refractive indices of the subcoat layer is different from a range of refractive indices of the first layer of the continuous layer, wherein the composition of the subcoat layer is different from a composition of the second layer of the continuous layer, wherein the range of refractive indices of the subcoat layer is different from a range of refractive indices of the second layer of the continuous layer, wherein the composition of the subcoat layer is different from a composition of the third layer wherein the range of refractive indices of the subcoat layer is different from a range of refractive indices of the third layer, wherein the composition of the subcoat layer is different from a composition of the fifth layer, and wherein the range of refractive indices of the subcoat layer is different from a range of refractive indices of the fifth layer, wherein the first fluorocarbon resin is partially removed from the subcoat layer, and wherein the subcoat layer is porous.

* * * * *